(12) United States Patent
Hasegawa

(10) Patent No.: US 11,871,525 B2
(45) Date of Patent: Jan. 9, 2024

(54) WIRING BOARD AND MANUFACTURING METHOD FOR SAME

(71) Applicant: KYOCERA Corporation, Kyoto (JP)

(72) Inventor: Yoshihiro Hasegawa, Yasu (JP)

(73) Assignee: KYOCERA CORPORATION, Kyoto (JP)

( * ) Notice: Subject to any disclaimer, the term of this patent is extended or adjusted under 35 U.S.C. 154(b) by 146 days.

(21) Appl. No.: 17/439,494

(22) PCT Filed: Dec. 17, 2019

(86) PCT No.: PCT/JP2019/049298
§ 371 (c)(1),
(2) Date: Sep. 15, 2021

(87) PCT Pub. No.: WO2020/188923
PCT Pub. Date: Sep. 24, 2020

(65) Prior Publication Data
US 2022/0159844 A1    May 19, 2022

(30) Foreign Application Priority Data

Mar. 15, 2019    (JP) ................................. 2019-048623

(51) Int. Cl.
*H05K 1/03*    (2006.01)
*H05K 3/46*    (2006.01)
*H05K 1/11*    (2006.01)

(52) U.S. Cl.
CPC ......... *H05K 3/4661* (2013.01); *H05K 1/0373* (2013.01); *H05K 1/116* (2013.01);
(Continued)

(58) Field of Classification Search
CPC ................. H05K 3/4661; H05K 1/116; H05K 2201/0209; H05K 3/388; H05K 1/0366;
(Continued)

(56) References Cited

U.S. PATENT DOCUMENTS

2010/0025253 A1* 2/2010 Yoshioka ............... C25D 11/06
205/333
2010/0326709 A1* 12/2010 Kawano ................. H05K 3/421
174/257

(Continued)

FOREIGN PATENT DOCUMENTS

| JP | 2010-157589 A | 7/2010 |
|---|---|---|
| JP | 2014-062150 A | 4/2014 |
| JP | 2017-069524 A | 4/2017 |

*Primary Examiner* — Steven T Sawyer
(74) *Attorney, Agent, or Firm* — Volpe Koenig

(57) ABSTRACT

A wiring board according to the present disclosure has at least a structure in which a wiring conductor layer is layered on a surface of an insulating layer containing particles of silica, and some particles of silica among the particles of silica contained in the insulating layer are partially exposed on the surface of the insulating layer. The wiring conductor layer includes a seed layer in contact with the insulating layer and a plated conductor layer formed on a surface of the seed layer. At a contact surface between the exposed portions of the particles of silica and the seed layer, an amorphous layer of silica derived from the particles of silica and an amorphous layer of metal derived from metal forming the seed layer are present.

5 Claims, 5 Drawing Sheets

(52) U.S. Cl.
CPC ............... *H05K 2201/0209* (2013.01); *H05K 2201/0338* (2013.01)

(58) Field of Classification Search
CPC ......... H05K 1/0373; H05K 2201/0338; H05K 2201/0344; B32B 7/025; B32B 9/00; B32B 15/08
See application file for complete search history.

(56) References Cited

U.S. PATENT DOCUMENTS

| | | | |
|---|---|---|---|
| 2011/0240358 A1* | 10/2011 | Nakai | H05K 3/108 |
| | | | 174/268 |
| 2011/0247865 A1 | 10/2011 | Tsurumi | |
| 2013/0118787 A1* | 5/2013 | Kim | C08K 9/04 |
| | | | 521/64 |
| 2017/0098600 A1* | 4/2017 | Sakai | H01L 23/5226 |
| 2018/0376589 A1* | 12/2018 | Harazono | H05K 1/115 |
| 2019/0326422 A1* | 10/2019 | Muir | H01L 29/4908 |
| 2020/0154574 A1* | 5/2020 | Kim | H05K 3/108 |

* cited by examiner

WIRING BOARD AND MANUFACTURING METHOD FOR SAME

TECHNICAL FIELD

The present disclosure relates to a wiring board and a manufacturing method for the same.

BACKGROUND ART

In a wiring board on which electronic components such as semiconductor elements and capacitors are mounted, the thermal expansion coefficient of an insulating resin layer included in the wiring board is generally larger than that of the electronic components such as semiconductor elements. Therefore, the wiring board is susceptible to thermal expansion due to the heat applied when mounting the electronic components and the heat generated during the operation of a device including the wiring board. In order to suppress such thermal expansion, it is conceivable to reduce the thermal expansion coefficient of the insulating resin layer. For example, Patent Document 1 describes dispersing particles of silica in the insulating resin layer.

CITATION LIST

Patent Literature

Patent Document 1: JP 2014-62150 A

SUMMARY

A wiring board according to the present disclosure includes at least a structure in which a wiring conductor layer is layered on a surface of an insulating layer containing particles of silica. Among the particles of the silica contained in the insulating layer, some particles of silica are partially exposed on the surface of the insulating layer. The wiring conductor layer includes a seed layer in contact with the insulating layer and a plated conductor layer formed on a surface of the seed layer. An amorphous layer of the silica derived from the particles of the silica and an amorphous layer of metal derived from a metal forming the seed layer are present at a contact surface between exposed portions of the particles of the silica and the seed layer.

A manufacturing method for a wiring board according to the present disclosure includes the following steps.

A step of forming an insulating layer that contains particles of silica and of which some particles of silica are exposed on a surface of the insulating layer.

A step of treating the insulating layer with a solution in which a compound containing at least one of an alkali metal element and an alkaline earth metal element is dissolved.

A step of forming a seed layer on a surface of the insulating layer by subjecting the insulating layer that has been treated with the solution to sputtering.

A step of forming a plated conductor layer on a surface of the seed layer.

DESCRIPTION OF EMBODIMENTS

Figure 1:
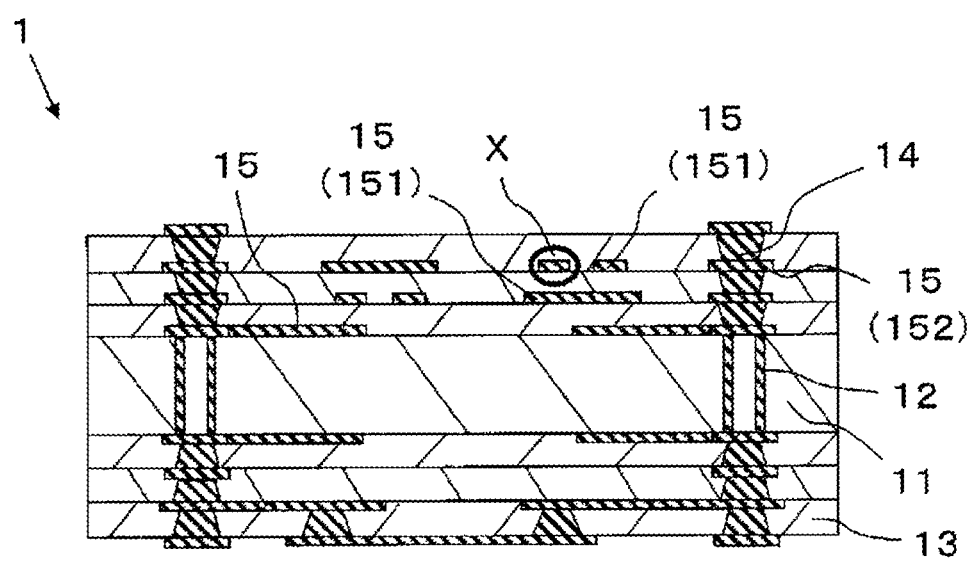
FIG. 1 is a cross-sectional view illustrating a wiring board according to an embodiment of the present disclosure.

A resin, which is a main component of an insulating layer, chemically bonds with an electrical conductor layer (metal) through functional groups developed on the resin surface by plasma treatment or the like. However, chemically stable silica does not chemically bond with the electrical conductor layer, and the electrical conductor layer merely adheres to the silica surface. As a result, when a large amount of particles of silica are contained in the insulating layer in order to reduce the thermal expansion coefficient of the substrate, the contact surface area between the particles of silica and the electrical conductor layer increases, and the adhesiveness between the resin and the electrical conductor layer decreases. Therefore, the electrical conductor layer easily peels off from the insulating layer, and an electrical signal cannot be favorably transmitted via the wiring conductor. As a result, the electrical reliability is lowered, for example because the semiconductor element does not operate stably.

In a wiring board according to the present disclosure, at a contact surface between exposed portions of particles of silica contained in an insulating layer and a seed layer, an amorphous layer of silica derived from the particles of silica and an amorphous layer of metal derived from metal forming the seed layer are present. In this manner, since an interface between the amorphous layer of metal and the amorphous layer of silica has minute irregularities as a result of the exposed portions of the particles of silica and the seed layer (wiring conductor layer) being in contact with each other between the respective amorphous layers, the contact surface area increases. Thus, the particles of silica and the seed layer (wiring conductor layer) can be firmly adhered to each other. As a result, the electrical conductor layer is less likely to peel off from the insulating layer, and the electrical reliability can be improved.

The wiring board according to an embodiment of the present disclosure will be described with reference to FIGS. 1 to 4. A wiring board 1 according to the embodiment illustrated in FIG. 1 includes a core layer 11 and insulating layers 13 layered on both sides of the core layer 11. The core layer 11 is not particularly limited as long as the core layer 11 is formed of a material having an insulating property. Examples of the material having an insulating property include resins such as an epoxy resin, a bismaleimide-triazine resin, a polyimide resin, and a polyphenylene ether resin. Two or more of these resins may be mixed and used. The thickness of the core layer 11 is not particularly limited and is, for example, 50 µm or more and 3000 µm or less.

The core layer 11 may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. Further, inorganic insulating fillers made of, for example, silica, barium sulfate, talc, clay, glass, calcium carbonate, or titanium oxide may be dispersed in the core layer 11.

A through hole conductor 12 is formed in the core layer 11 in order to electrically connect the upper and lower surfaces of the core layer 11. The through hole conductor 12 is formed in a through hole passing through the upper and lower surfaces of the core layer 11. The through hole conductor 12 is formed of a conductor consisting of metal plating such as copper plating, for example. The through hole conductor 12 is connected to electrical conductor layers 15 formed on both sides of the core layer 11. A via land 152 is one of the formed electrical conductor layers 15. The electrical conductor layers 15 will be described later. In the through hole conductor 12 formed in the wiring board 1 illustrated in FIG. 1, the conductor is formed only on an inner wall surface of the through hole formed in the core layer 11. However, the through hole may be filled with the conductor forming the through hole conductor 12.

Figure 3:
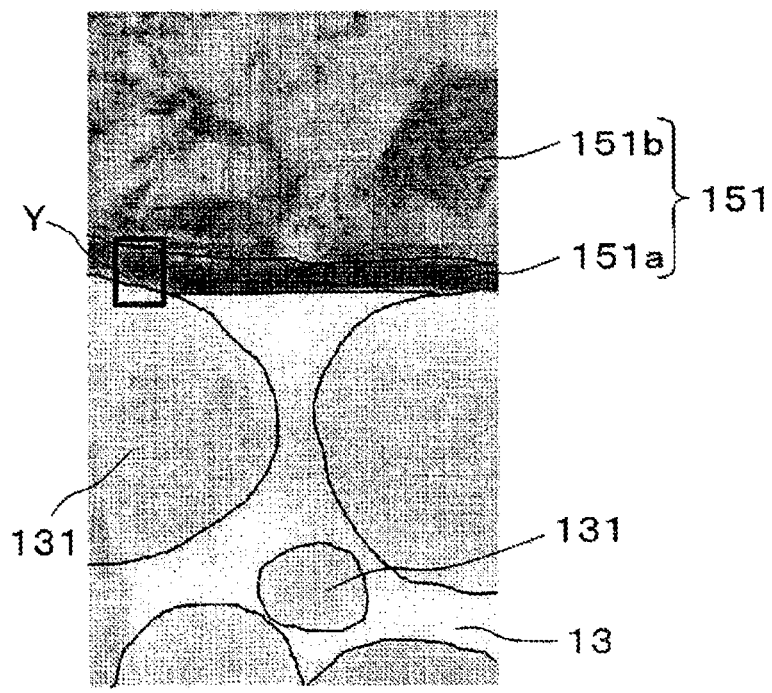
FIG. 3 is a transmission electron microscope (TEM) photograph illustrating an example of a region X' in the enlarged explanatory view illustrated in FIG. 2.

The insulating layers 13 are layered on both sides of the core layer 11. In the wiring board 1 illustrated in FIG. 1, three insulating layers 13 are layered on both sides of the core layer 11, respectively. As with the core layer 11, the insulating layers 13 are not particularly limited as long as the insulating layers 13 are formed of a material having an insulating property. Examples of the material having an insulating property include resins such as an epoxy resin, a bismaleimide-triazine resin, a polyimide resin, and a polyphenylene ether resin. Two or more of these resins may be mixed and used. The insulating layers 13 may be formed of the same resin or may be formed of different resins. The insulating layers 13 and the core layer 11 may be formed of the same resin or may be formed of different resins. Further, as illustrated in FIG. 3, particles of silica 131 are dispersed in the insulating layers 13.

The average particle size of the particles of silica 131 contained in the insulating layers 13 is not particularly limited. The particles of silica 131 may have an average particle size of, for example, 50 nm or more and 3 μm or less. As illustrated in FIG. 3, some particles of silica 131 among the particles of silica 131 contained in the insulating layers 13 are partially exposed on the surfaces of the insulating layers 13. In other words, parts of the particles of silica 131 near the surfaces of the insulating layers 13 are embedded in the insulating layers 13, and the remaining parts are exposed on the insulating layers 13.

The thickness of each of the insulating layers 13 is not particularly limited and is, for example, 3 μm or more and 50 μm or less. The insulating layers 13 may have the same thickness or may have different thicknesses.

A via hole filled with a via hole conductor 14 for electrically connecting the layers is formed in the insulating layers 13. A plurality of via holes are formed by, for example, a laser machining process using a $CO_2$ laser, a UV-YAG laser, or the like. The via hole may have a diameter of, for example, 3 μm or more and 100 μm or less. The via hole is filled with the via hole conductor 14, and a via bottom of the via hole conductor 14 is in contact with the via land 152, which is one of the electrical conductor layers 15.

Figure 2:
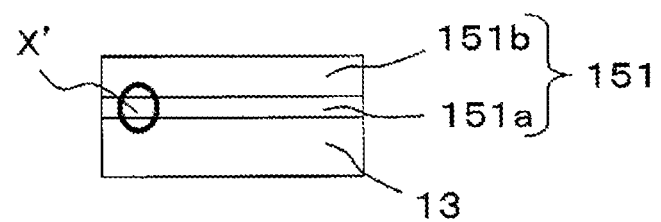
FIG. 2 is an enlarged explanatory view of a region X in the wiring board illustrated in FIG. 1.

Examples of the electrical conductor layer 15 formed on the surface of the insulating layer 13 also include a wiring conductor layer 151 other than the via land 152. As illustrated in FIG. 2, the wiring conductor layer 151 includes a seed layer 151*a* in contact with the insulating layer 13, and a plated conductor layer 151*b* formed on a surface of the seed layer 151*a*. Similar to the wiring conductor layer 151, the via land 152 also includes the seed layer 151*a* in contact with the insulating layer 13 and the plated conductor layer 151*b* formed on the surface of the seed layer 151*a*.

The seed layer 151*a* serves as a base for forming the plated conductor layer 151*b*. The insulating layer 13 is formed of a material having an insulating property such as a resin. Therefore, the plated conductor layer 151*b* cannot be directly formed on the surface of the insulating layer 13 by electroplating. The seed layer 151*a* is formed by, for example, sputtering. The seed layer 151*a* is formed of a metal capable of being subjected to sputtering. Examples of such a metal include metals including nickel (Ni), chromium (Cr), titanium (Ti), tantalum (Ta), vanadium (V), zirconium (Zr), niobium (Nb), and molybdenum (Mo). These metals may be used alone, or may be used in combinations of two types or more. An example of a combination of two types of metal is nichrome (NiCr).

The thickness of the seed layer 151*a* is not particularly limited as long as the seed layer 151*a* is thick enough to form the plated conductor layer 151*b* by electroplating. Considering the efficiency of electroplating, the seed layer 151*a* may have a thickness of, for example, 5 nm or more and 150 nm or less.

Figure 4:
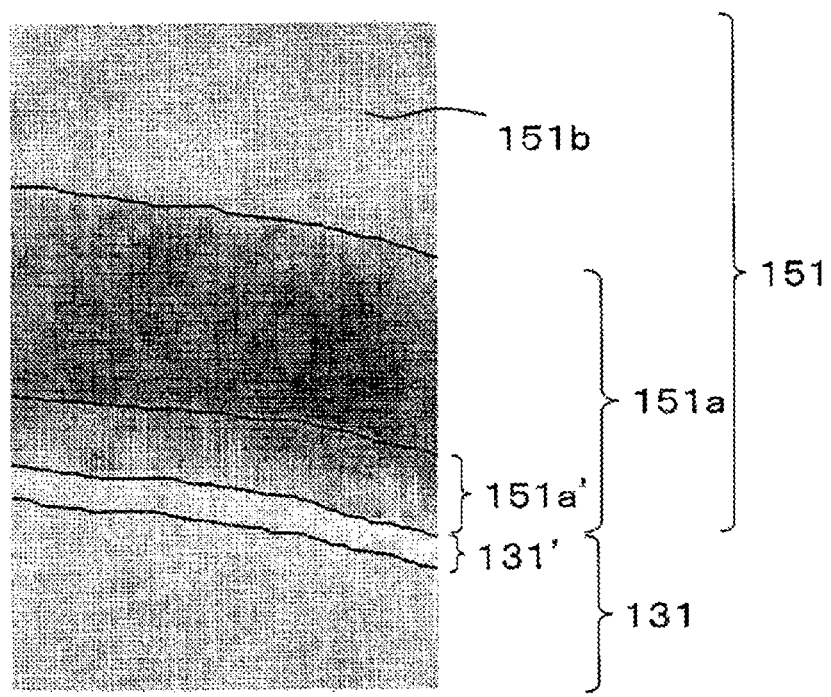
FIG. 4 is an enlarged view of a region Y in the TEM photograph illustrated in FIG. 3.

The seed layer 151*a* is layered on the surface of the insulating layer 13. Therefore, as illustrated in FIG. 3, the seed layer 151*a* is in contact with the particles of silica 131 exposed on the surface of the insulating layer 13. As illustrated in FIGS. 3 and 4, the seed layer 151*a* and the particles of silica 131 are in contact with each other in amorphous states at the contact surface. Specifically, on the side of the seed layer 151*a*, there is an amorphous layer of metal 151*a*' derived from a metal forming the seed layer 151*a*, and on the side of the particles of silica 131, there is an amorphous layer of silica 131' derived from the particles of silica 131. The amorphous layer of metal 151*a*' and the amorphous layer of silica 131' are in contact with each other. There are minute irregularities at the interface between the amorphous layer of metal 151*a*' and the amorphous layer of silica 131'. As a result, the contact surface area between the amorphous layer of metal 151*a*' and the amorphous layer of silica 131' is increased, and the amorphous layer of metal 151*a*' and the amorphous layer of silica 131' are firmly adhered to each other.

The thickness of the amorphous layer of metal 151*a*' present in the seed layer 151*a* is not particularly limited. The amorphous layer of metal 151*a*' has a thickness of, for example, 10 nm or more and 30 nm or less. On the other hand, the thickness of the amorphous layer of silica 131' present in the particles of silica 131 is not particularly limited. The amorphous layer of silica 131' has a thickness of, for example, 2 nm or more and 20 nm or less. When the amorphous layer of metal 151*a*' and the amorphous layer of silica 131' have such thicknesses, the seed layer 151*a* and the particles of silica 131 can be more firmly adhered to each other.

When the thickness of the amorphous layer of metal 151*a*' is larger than the thickness of the amorphous layer of silica 131', it is advantageous in that, for example, the stress caused by the difference in thermal expansion between the electrical conductor layer 15 and the insulating layer 13 is reduced and peeling is easily reduced due to the amorphous layer of metal 151*a*', which is more elastic than the amorphous layer of silica 131'. The amorphous layer can be confirmed as a structural portion having no regularity by, for example, observation with a transmission electron microscope. In addition, the thickness of each of the above amorphous layers refers to the size in the thickness direction of the insulating layer 13, and can be measured by observation using the transmission electron microscope described above.

The surface roughness of the contact surface between the amorphous layer of metal 151*a*' and the amorphous layer of silica 131' may be, for example, 1 nm or more and 50 nm or less in terms of further strengthening the adhesion.

In the wiring board 1 according to the embodiment, as illustrated in FIG. 2, the plated conductor layer 151b is layered on the surface of the seed layer 151a. The plated conductor layer 151b is formed of a metal such as copper (Cu). The thickness of the plated conductor layer 151b is not particularly limited. The plated conductor layer 151b has a thickness of, for example, 1 μm or more and 60 μm or less.

A method for manufacturing the wiring board according to the present disclosure is not particularly limited. For example, the wiring board 1 according to the embodiment can be obtained by, for example, the following method.

First, the core layer 11 in which the through hole conductor 12 is formed is prepared. The through hole conductor 12 is obtained by precipitating, for example, a conductor made of metal plating such as copper plating on the inner wall surface of the through hole formed so as to pass through the upper and lower surfaces of the core layer 11. The through hole is formed by, for example, a drilling process, a laser machining process, or a blasting process. The thickness of the core layer 11 is as described above and is, for example, 50 μm or more and 3000 μm or less.

Subsequently, the electrical conductor layers 15 are formed on both surfaces of the core layer 11. The electrical conductor layers 15 are exposed and developed by attaching dry films, which are etching resists, to conductors (copper foils) formed on both surfaces of the core layer 11 by a known method. Thereafter, when the dry films are peeled off by etching, the electrical conductor layers 15 are formed on both surfaces of the core layer 11. The via land 152 is one of the formed electrical conductor layers 15. The through hole conductor 12 formed in the core layer 11 is electrically connected to the electrical conductor layers 15 formed on both surfaces of the core layer 11.

Subsequently, the insulating layers 13 containing the particles of silica 131 are formed on the upper and lower surfaces of the core layer 11 to obtain a laminate. The insulating layers 13 are formed by, for example, placing films for the insulating layers 13 on the upper and lower surfaces of the core layer 11 and hot-pressing the films. The thickness of each of the insulating layers 13 is as described above, for example, 3 μm or more and 50 μm or less.

Subsequently, the via hole is formed in the insulating layers 13. The via hole is formed such that the via land 152, which is one of the wiring conductor layers, is at the bottom. The via hole is formed by, for example, a $CO_2$ laser, a UV-YAG laser, or the like. The diameter of the via hole is as described above and, for example, is 3 μm or more and 100 μm or less.

Subsequently, the surface of the insulating layer 13 and the inside of the via hole are subjected to plasma treatment (for example, oxygen, argon, nitrogen, fluorine, and the like) to roughen the surfaces, thereby partially exposing some particles of silica 131 among the particles of silica 131 contained in the insulating layer 13 on the surface of the insulating layer 13. When some particles of silica 131 are exposed on the surface of the insulating layer 13 without performing plasma treatment, the step of roughening the surface of the insulating layer 13 may be omitted.

Subsequently, the surface of the insulating layer 13 and the inside of the via hole are treated with a solution in which a compound containing at least one of an alkali metal element and an alkaline earth metal element is dissolved. The compound containing at least one of the alkali metal element and the alkaline earth metal element is not particularly limited, and examples thereof include potassium permanganate, permanganate acid, sodium hydroxide, and sodium carbonate. By applying the solution in which such a compound is dissolved to the surface of the insulating layer 13, such a compound also adheres to the surfaces of the particles of silica 131 exposed on the surface of the insulating layer 13. Examples of a coating method include dipping, spraying, brush coating, and roller coating.

Subsequently, the laminate including the core layer 11 and the insulating layers 13 is subjected to sputtering to form the seed layer 151a on the surfaces of the insulating layers 13 and in the via holes. As described above, the seed layer 151a is formed of a metal, examples of which include nickel (Ni), chromium (Cr), titanium (Ti), tantalum (Ta), vanadium (V), zirconium (Zr), niobium (Nb), and molybdenum (Mo). These metals may be used alone, or may be used in combinations of two types or more. An example of a combination of two types of metal is nichrome (NiCr). When nichrome is used, it is advantageous in that, when forming the wiring conductor layer 151 described later, it is easy to remove an unnecessary portion of the seed layer 151a other than the portion in which the wiring conductor layer 151 is to be formed, by etching.

By subjecting the laminate including the core layer 11 and the insulating layers 13 to sputtering, the metal forming the seed layer 151a collides with the particles of silica 131 to which the compound described above is attached, and thermal energy is generated. The generated thermal energy causes change and dislocation in atomic arrangement on the surfaces of the particles of silica 131 exposed on the surfaces of the insulating layers 13. As a result, the surfaces of the particles of silica 131 exposed on the surfaces of the insulating layers 13 change to an amorphous state, and the amorphous layer of silica 131' is formed. The amorphous layer of silica 131' has a thickness of 2 nm or more and 20 nm or less as described above.

In parallel with the formation of the amorphous layer of silica 131', the seed layer 151a is formed on the surface of the insulating layer 13 and the surfaces of the particles of silica 131 exposed on the surface of the insulating layer 13. At that time, amorphous information is transmitted to the metal adhered to the surfaces of the particles of silica 131, and part of the seed layer 151a (the contact surface with the particles of silica 131) changes to an amorphous state, and the amorphous layer of metal 151a' is formed. As described above, the amorphous layer of metal 151a' has a thickness of 10 nm or more and 30 nm or less. The surface roughness of the contact surface between the amorphous layer of metal 151a' and the amorphous layer of silica 131' may be, for example, 1 nm or more and 50 nm or less.

Subsequently, the plated conductor layer 151b is layered on the surface of the seed layer 151a to form the wiring conductor layer 151 having a layered structure of the seed layer 151a and the plated conductor layer 151b. At this time, the via hole conductor 14 is formed simultaneously with the wiring conductor layer 151. The plated conductor layer 151b is formed of a metal such as copper (Cu) as described above. The thickness of the plated conductor layer 151b is not particularly limited. The plated conductor layer 151b has a thickness of, for example, 1 μm or more and 60 μm or less. Similar to the wiring conductor layer 151, the via land 152 is also formed by layering the plated conductor layer 151b on the surface of the seed layer 151a in contact with the insulating layer 13.

Further, the layering of the insulating layers 13 and the formation of the electrical conductor layers 15 (the wiring conductor layer 151 and the via land 152) are repeated twice in a similar procedure to obtain the wiring board 1 in which three insulating layers are layered on the upper and lower surfaces of the core layer 11, respectively.

In the wiring board 1 obtained in this manner, at the contact surface between the exposed portions of the particles of silica 131 contained in the insulating layer 13 and the seed layer 151a, the amorphous layer of silica 131' derived from the particles of silica 131 and the amorphous layer of metal 151a' derived from the metal forming the seed layer 151a are present. In this manner, since the exposed portions of the particles of silica 131 and the seed layer 151a (wiring conductor layer 151) are in contact with each other between the respective amorphous layers having the minute irregularities at the interface as described above, the contact surface area increases. Thus, the particles of silica 131 and the seed layer 151a (wiring conductor layer 151) can be firmly adhered to each other. As a result, the wiring conductor layer 151 is less likely to peel off from the insulating layer 13, and the electrical reliability can be improved.

For a wiring board in which an amorphous layer of metal and an amorphous layer of silica are present (amorphous wiring board) and a wiring board in which the amorphous layer is not present (amorphous-free wiring board), the adhesion strength between the insulating layer and the electrical conductor layer was evaluated. A sample of the amorphous wiring board was prepared by the following procedure.

First, an insulating layer containing particles of silica (average particle size: 2.0 µm) was subjected to sputtering to form a seed layer made of NiCr on a surface of the insulating layer. A build-up film manufactured by Ajinomoto Fine-Techno Co., Inc. was used as a material for the insulating layer. By subjecting the material to sputtering, the surfaces of the particles of silica change to an amorphous state, and an amorphous layer of silica is formed. In parallel, the seed layer is formed on the surface of the insulating layer and on the surfaces of the particles of silica exposed on the surface of the insulating layer. At this time, amorphous information is transmitted to metal adhered to the surfaces of the particles of silica, part of the seed layer (the contact surface with the particles of silica) changes to an amorphous state, and an amorphous layer of metal is formed. A copper plating layer having a thickness of approximately 18 µm was formed on an upper surface of the seed layer to obtain the sample having a width of 1 cm and a length of approximately 10 cm. In this manner, six samples were prepared.

Next, a sample of the amorphous free wiring board was prepared by the following procedure. An insulating layer containing particles of silica was subjected to an electroless plating treatment, and a metal layer made of electroless copper was formed on a surface of the insulating layer. As the materials of the particles of silica and the insulating layer, the same materials as the sample of the amorphous wiring board were used. It was confirmed that no amorphous layer was present on the surfaces of the particles of silica and the metal layer. A copper plating layer having a thickness of approximately 18 µm was formed on an upper surface of the metal layer to obtain the sample having a width of 1 cm and a length of approximately 10 cm. In this manner, six samples were prepared.

Figure 5:
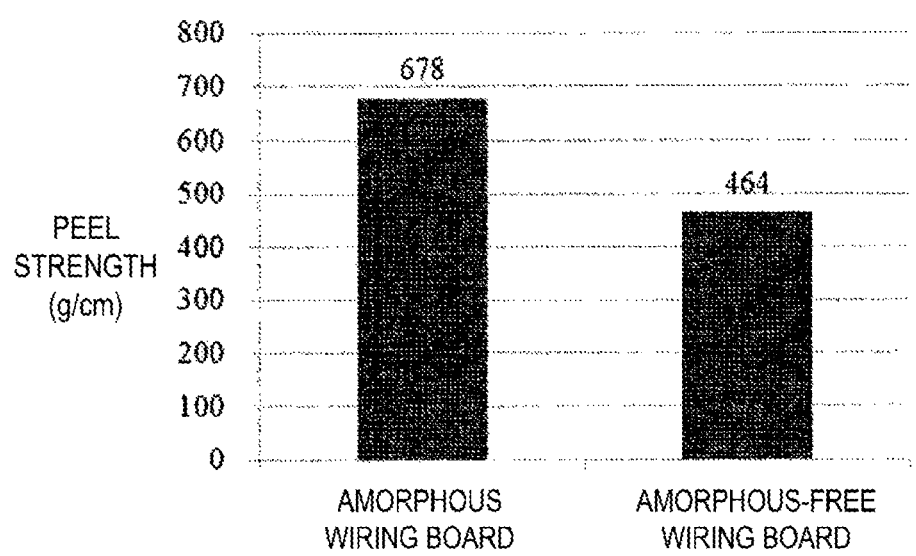
FIG. 5 is a graph showing results of a peel strength test.

Each of the obtained samples was subjected to a peel strength test, and the peel strength was measured. The peel strength test was performed under the following conditions according to the method described in HS C6481. Six samples for each wiring board were tested, and the average was calculated. The results are shown in FIG. 5. As is clear from FIG. 5, it can be seen that the wiring board in which the amorphous layer of metal and the amorphous layer of silica are present (amorphous wiring board) has higher peel strength and is superior in adhesion strength.

Peel Strength Test

Test equipment: Tensile tester Speed: 50 mm/min

The wiring board of the present disclosure is not limited to the above-described embodiment. For example, in the wiring board 1 described above, three insulating layers 13 are layered on both sides of the core layer 11, respectively. However, since the core layer 11 is also an insulating layer, the wiring board of the present disclosure may have at least one insulating layer 13 formed on at least one surface of the core layer 11. Further, the number of layers of the insulating layer 13 formed on the core layer 11 may be different on the upper and lower surfaces.

The wiring board 1 described above includes the core layer 11. However, in the wiring board of the present disclosure, the core layer 11 is not an essential member, but is an optional member. Accordingly, the wiring board of the present disclosure may be in the form of a coreless substrate.

Further, the method described above is not the only method for obtaining the wiring board of the present disclosure. The method is not particularly limited as long as the method in which the amorphous layer of silica derived from the particles of silica and the amorphous layer of metal derived from the metal forming the seed layer can be present at the contact surface between the exposed portions of the particles of silica contained in the insulating layer and the seed layer.

REFERENCE SIGNS LIST

1 Wiring board
11 Core layer
12 Through hole conductor
13 Insulating layer
131 Particle of silica
131' Amorphous layer of silica
14 Via hole conductor
15 Electrical conductor layer
151 Wiring conductor layer
152 Via land
151a Seed layer
151b Plated conductor layer
151a' Amorphous layer of metal

The invention claimed is:

1. A wiring board comprising: at least an insulating layer containing particles of silica, and a wiring conductor layer located on the insulating layer, wherein among the particles of the silica contained in the insulating layer, some particles of the silica are partially exposed on a surface of the insulating layer, the wiring conductor layer comprises a seed layer located on the insulating layer and containing a metal, and a plated conductor layer located on the seed layer, and a non-crystalline layer of the silica and a non-crystalline layer of the metal of the seed layer are present at contact portions between exposed portions of the particles of the silica and the seed layer; wherein a thickness of the non-crystalline layer of the metal is larger than a thickness of the non-crystalline layer of the silica.

2. The wiring board according to claim 1, wherein the metal of the seed layer comprises at least one selected from a group consisting of nickel, chromium, titanium, and tantalum.

3. The wiring board according to claim 1, wherein the metal of the seed layer is nichrome.

4. The wiring board according to claim 1, wherein
at the contact portions, the non-crystalline layer of the silica and the non-crystalline layer of the metal of the seed layer are in contact with each other.
5. The wiring board according to claim 4, wherein
a contact surface between the non-crystalline layer of the silica and the non-crystalline layer of the metal of the seed layer has irregularities.

\* \* \* \* \*